United States Patent
Korobkov

(10) Patent No.: US 6,912,705 B2
(45) Date of Patent: Jun. 28, 2005

(54) METHOD AND APPARATUS FOR PERFORMING OPERATION ON PHYSICAL DESIGN DATA

(75) Inventor: Alexander I. Korobkov, Sunnyvale, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 178 days.

(21) Appl. No.: 10/185,502

(22) Filed: Jun. 27, 2002

(65) Prior Publication Data
US 2004/0003365 A1 Jan. 1, 2004

(51) Int. Cl.[7] .......... G06F 9/455; G06F 17/50; G06F 9/45
(52) U.S. Cl. ........... 716/11; 716/2; 716/3; 716/4; 716/5; 716/7; 716/8; 716/9; 716/10; 716/12
(58) Field of Search ............ 716/1–5, 7–11, 716/18

(56) References Cited

U.S. PATENT DOCUMENTS

| | | | |
|---|---|---|---|
| 5,592,663 A | * | 1/1997 | Nagamori .................. 707/5 |
| 5,615,137 A | | 3/1997 | Holzmann et al. ......... 364/578 |
| 5,870,313 A | * | 2/1999 | Boyle et al. ............... 716/10 |
| 6,009,251 A | * | 12/1999 | Ho et al. .................... 716/5 |
| 6,011,911 A | * | 1/2000 | Ho et al. .................... 716/5 |
| 6,063,132 A | | 5/2000 | DeCamp et al. ............ 716/5 |
| 6,341,366 B1 | | 1/2002 | Wang et al. ................ 716/11 |
| 6,598,211 B2 | * | 7/2003 | Zachariah et al. .......... 716/4 |
| 6,684,376 B1 | * | 1/2004 | Kerzman et al. ........... 716/8 |

OTHER PUBLICATIONS

Thomas H. Cormen et al., "Introduction to Algorithms" The MIT Press, Publication date, Jul. 16, 2001, 5 pages.

* cited by examiner

Primary Examiner—Leigh M. Garbowski
(74) Attorney, Agent, or Firm—Gunnison, McKay & Hodgson, L.L.P.

(57) ABSTRACT

A method performs an operation on physical design data stored as data objects in a database. Each data object represents a design figure of an integrated circuit (IC) design laid-out on an IC design area. The method includes (a) dividing the IC design area into a second plurality of sub-areas, (b) assigning an area property to each of the data objects, the area property indicating the sub-areas on which at least part of the corresponding design figure is to be located, (c) selecting a first data object, and (d) conducting an operation involving the first data object and a second data object involving selecting the second data object from a subset of data objects having an area property indicating a sub-area indicated by an area property of the first data object, and performing the operation on the first data object and the second data object.

33 Claims, 10 Drawing Sheets

METHOD AND APPARATUS FOR PERFORMING OPERATION ON PHYSICAL DESIGN DATA

FIELD OF THE INVENTION

The present invention relates to integrated circuit (IC) design processes. More particularly, the present invention relates to a method and apparatus for performing operations on physical design data stored as data objects in a database.

BACKGROUND OF THE INVENTION

The current level of silicon technology allows implementing integrated circuits (ICs) of very high complexity and performance. In the physical implementation process, the electrical circuit to be implemented in an IC design is converted into a geometric representation. Each of the circuit logic components, such as cells, macrocells, gates, transistors, other electrical components and the like, is converted into a geometric representation, i.e., specific shapes in multiple layers, or layout. Connections between logic components are also expressed as geometric patterns, typically as wires or lines and vias in multiple layers. Various operations such as verification, validation, and extraction are performed on the geometric representation during the physical design implementation. The physical design process is typically broken down into sub-processes, and various well-known electronic design automation (EDA) software tools are used to perform these sub-processes. The geometric representation (physical design data) of the circuit design is stored in a certain database format compatible with the tools, sub-processes, and/or operations performed thereon.

As the complexity of IC designs increases, the amount of physical design data to be handled by such design tools also increases dramatically, so that it may reach millions of data objects per physical design database. This means that on-chip extraction and verification processes, especially those that involve operations applicable to two or more database objects at one time, require a considerable amount of time just for accessing the objects in the database. However, the market requires short turn-around times and thus there is less time available to spend on the design phase of an IC.

BRIEF DESCRIPTION OF THE INVENTION

A method performs an operation on physical design data stored as data objects in a database. Each data object represents a design figure of an integrated circuit (IC) design laid-out on an IC design area. The method includes (a) dividing the IC design area into a second plurality of sub-areas, (b) assigning an area property to each of the data objects, the area property indicating the sub-areas on which at least part of the corresponding design figure is to be located, (c) selecting a first data object, and (d) conducting an operation involving the first data object and a second data object which involves selecting the second data object from a subset of data objects having an area property indicating a sub-area indicated by an area property of the first data object, and performing the operation on the first data object and the second data object.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of a method and apparatus for performing an operation on physical design data. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with one embodiment of the present invention, the components, processes and/or data structures may be implemented using C or C++ programs running on high performance computers (such as an Enterprise 2000™ server running Sun Solaris™ as its operating system. The Enterprise 2000™ server and Sun Solaris ™ operating system are products available from Microsystems, Inc. of Palo Alto, Calif.). Different implementations may be used and may include other types of operating systems, such as Microsoft® Windows® NT, available form Microsoft Corporation of Redmond, Wash., the Unix operating systems such as Linux available from a number of vendors, computing platforms, computer programs, firmware, computer languages and/or general-purpose machines.

Figure 1A:
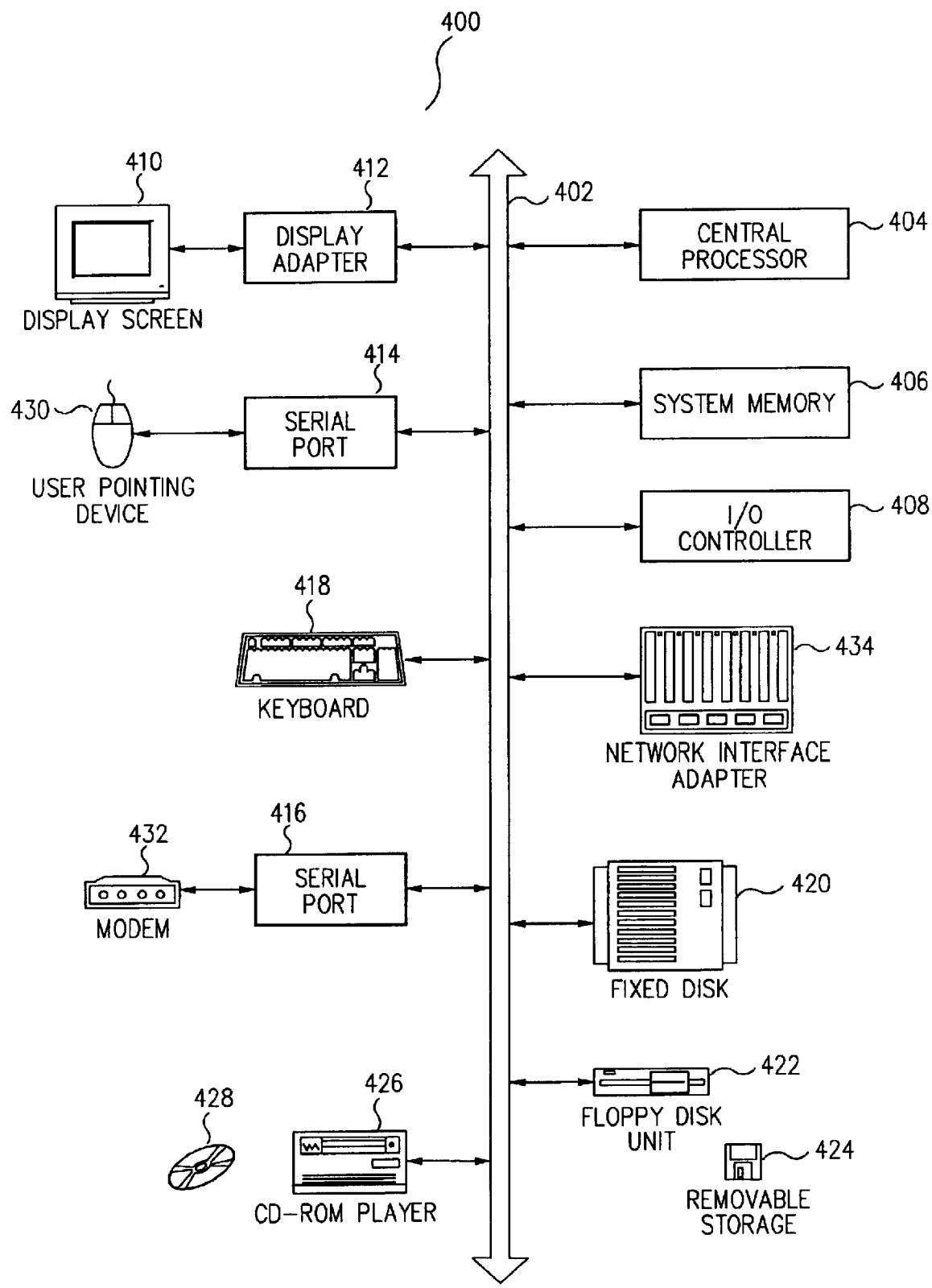
FIG. 1A is a block diagram schematically illustrating a computer system suitable for implementing aspects of the present invention.

FIG. 1A depicts a block diagram of a computer system 400 suitable for implementing aspects of the present invention. As shown in FIG. 1A computer system 400 includes a bus 402 which interconnects major subsystems such as a central processor 404, a system memory 406 (typically RAM), an input/output (I/O) controller 408, an external device such as a display screen 410 via display adapter 412, serial ports 414 and 416, a keyboard 418, a fixed disk drive 420, a floppy disk drive 422 operative to receive a floppy disk 424, and a CD-ROM player 426 operative to receive a CD-ROM 428. Many other devices can be connected, such as a pointing device 430 (e.g., a mouse) connected via serial port 414 and a modem 432 connected via serial port 416. Modem 432 may provide a direct connection to a remote server via a telephone link or to the Internet via a point of presence (POP). Alternatively, a network interface adapter 434 may be used to interface to a local or wide area network using any network interface system known to those skilled in the art (e.g., Ethernet, xDSL, AppleTalk™).

Many other devices or subsystems (not shown) may be connected in a similar manner. Also, it is not necessary for all of the devices shown in FIG. 1A to be present to practice the present invention, as discussed below. Furthermore, the devices and subsystems may be interconnected in different ways from that shown in FIG. 1A. The operation of a computer system such as that shown in FIG. 1A is readily known in the art and is not discussed in detail in this application, so as not to overcomplicate the present discussion. Code to implement the present invention may be operably disposed in system memory 406 or stored on storage media such as fixed disk 420, floppy disk 424 or CD-ROM 428.

As mentioned above, the geometric representation (physical design data) of an IC design is stored in a database of a certain format depending on the tools, sub-processes, and/or operations performed thereon. Typically, a number of EDA tools provided by different vendors are involved in the IC design process. The Opus database, available form Cadence Design Systems, Inc. San Jose, Calif., is a standard format database used for the physical data storage and maintenance of various types of ICs, such as microprocessors, memory units, and application specific integrated circuits (ASICs). The Opus data format is typically used by Opus applications (and their compatibles) which provide a layout view, manual check, and other interactive operations on the physical data. The GDSII is another standard data format typically independent of design tools, and used to translate physical design data between different tools and to generate the final design data for fabrication to be sent to a factory.

In a typical design flow, physical design data are converted from the Opus database format into the GDSII format so that some EDA tools can perform necessary data processing thereon. Then, the processed data are translated back into the format used by the Opus database since manual check or some additional interactive operations are usually needed before the next design step. Some vendors, such as Cadence Design Systems, Inc., provide an EDA toolkit or application programming interface (API) that allows direct access to physical design data objects in the Opus database so as to eliminate time-consuming data translation. Thus, an increasing number of "in-house" applications developed by IC design companies have direct access to the Opus database. Since vendor-provided Opus API functions are not necessarily optimized for such in-house Opus applications, in order to avoid performance degradation, the Opus database is often replaced by another database which is more optimized for certain operation types. Alternatively, most of the time-consuming operations are shifted to the EDA tools rather than performed by the in-house Opus applications. However, both approaches involve data translation between different database formats, which is becoming another limitation factor especially for the case of high performance processor design. Also most of these techniques require additional data transformation since not all of the Opus data object types are supported by those applications.

accordance with one embodiment of the present invention, a method directly performs operations on physical design data stored as data objects in a database without involving any data translation or transformation. The method also utilizes internal database functionality of the database to handle the physical design data. Such a database may be an Opus database, database using the Opus database format, or any database storing physical data as data objects with properties, as described below. Each of the data objects represents a design figure of an IC design. A design figure is a geometrical representation of an element (circuit component) of the IC design, such as a cell, macrocell, circuit core, gate, transistor, wire, via and the like. An IC design includes a number of design figures that are laid-out in an IC design area, typically an IC chip area.

Figure 1B:
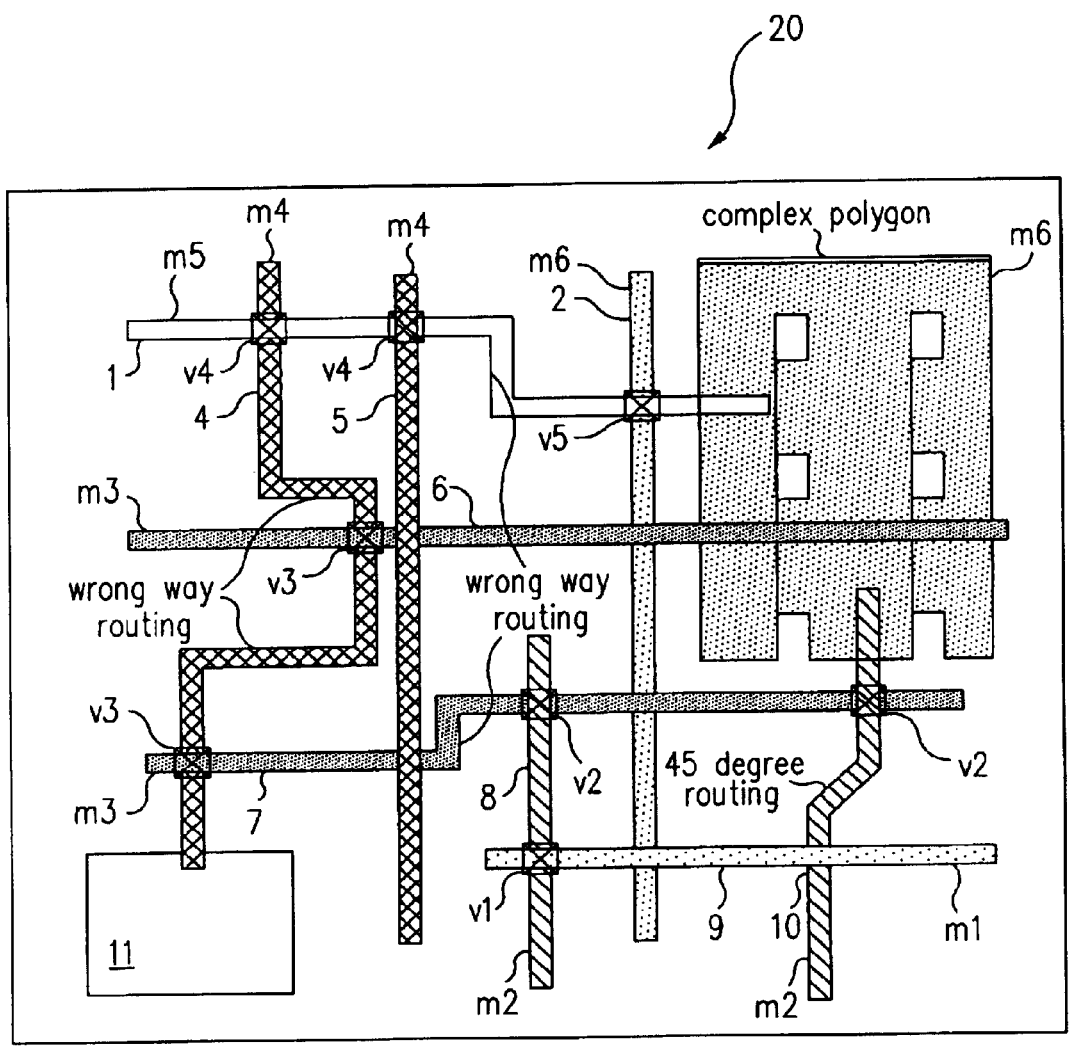
FIG. 1B is a diagram schematically illustrating an example of a geometrical representation of circuit components stored in a database.

FIG. 1B schematically illustrates an example of a geometrical representation of circuit components of an IC design stored in a database. FIG. 1B only shows a flat design with metal routing objects for simplicity. Each database object has geometrical properties such as coordinates of the design figure and non-geometrical properties such as figure type, metal layer, connectivity data, and the like. As shown in FIG. 1B, an IC design area 20 includes a plurality of design FIGS. 1–10. The IC design includes metal layers m6–m1 (typically from the top metal layer m6 to the bottom metal layer m1). Each two adjacent metal layers are connected each other by via layers v5–v1. The metal layers m6 and m5 are connected by the via layer v5, the metal layers m5 and m4 are connected by the via layer v4, and so on.

Each metal layer has a designated routing direction. For example, the metal layer m1 has the horizontal direction (design FIG. 9), and the metal layer m2 has the vertical direction (design FIGS. 8 and 10 ). However, the routing direction may be changed as seen in the design FIGS. 1, 4, and 7. This type of "wrong way" routing is not restricted by the Opus data format. Various different types of design figures, such as very complicated polygons (design FIG. 3) and 45-degree routing (design FIG. 10) may also be represented in the database as well as other ordinary deign figures (for example, design FIG. 11). It should be noted that the number of the design figures, type of the design figures, and the number of metal layers are used by way of example and are not intended to be exhaustive or limiting in any way.

Figure 2:
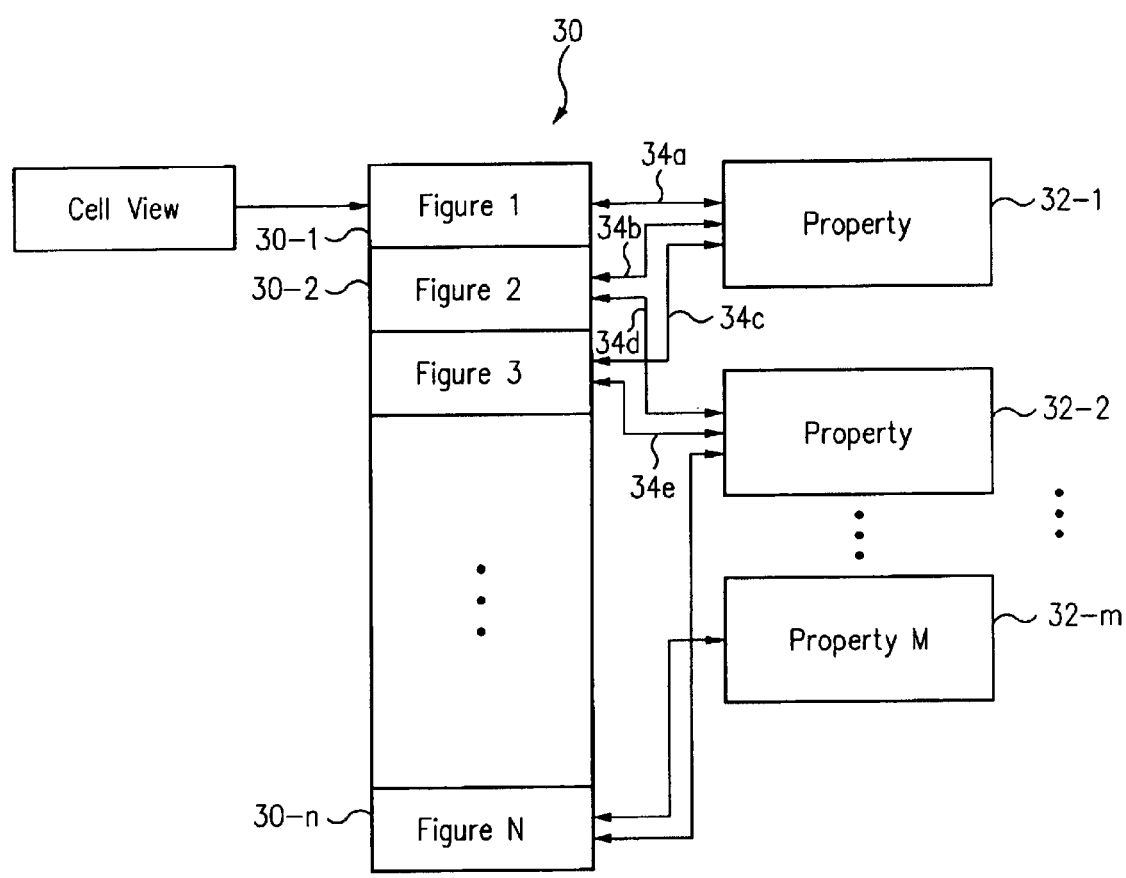
FIG. 2 is a diagram schematically illustrating a conventional physical design data structure of an Opus database.

FIG. 2 schematically illustrates a conventional physical design data structure of an Opus database. As shown in FIG. 2, a cell view entity contains data objects 30 (30-1, 30-2, ..., 30-*n*) representing design figures (FIG. 1, FIG. 2, ..., figure n) which can be accessed by traversing a unidirectional linked list. Each data object 30 includes links to properties 32 (32-1, 32-2, ..., 32-*m*) associated with the corresponding design figure. Some properties are predetermined (for example, coordinates, figure type, layer, and the like), and others may be assigned by a user (such as connectivity data). For example, property 32-1 may be coordinates of the design figure, and a link 34*a* between the data object 30-1 and the property 32-1 provides the coordinates of the design FIG. 1. Similarly, a link 34-*b* between the data object 30-2 and the property 32-1 provides coordinates of the design FIG. 2. If the property 32-2 specifies the type (or layer) of the design figures, a link 34-*d* provides the type (or layer) of the design FIG. 2, and a link 34-2 provides the type (or layer) of the design FIG. 3. It should be noted that FIG. 2 does not show all of the links between the data objects 30 and the properties 32 for simplicity.

Figure 3C:
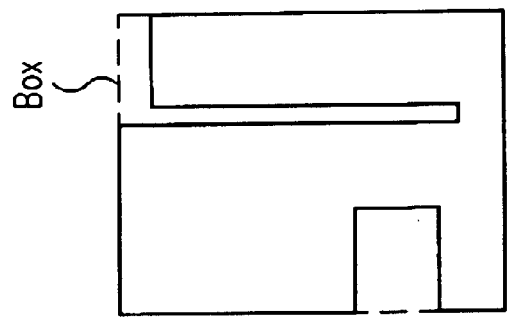
FIGS. 3A, 3B and 3C are diagrams schematically illustrating examples of design figure types.
Figure 3B:
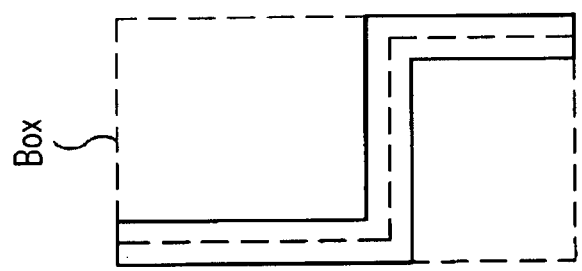
Figure 3A:
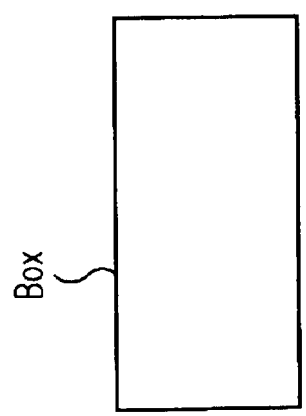

FIGS. 3A, 3B and 3C schematically illustrate examples of design figures. A set of coordinates may be different depend on the design figure types. For example, a design figure may be a simple rectangle, path, or polygon, as shown in FIGS. 3A, 3B, and 3C, respectively. A simple rectangular figure may have coordinates defining the origin (or center), along with the width and length as other properties, and a path-type figure may have coordinates defining its centerline, along with the width as another property. A polygon-type figure may have coordinates for all of the vertices.

During a physical design process such as verification or extraction, these design figures are accessed and various types of operations are performed thereon. Most of the operations involve one design figure per performance, and their complexity is "linear" (or slightly super-linear), i.e., if an operation takes t seconds per design figure, it takes approximately nxt seconds to perform the operation on n design figures. Such operations are referred to as "first-order" operations, and they are typically performed relatively quickly.

Operations involving two design figures per performance are referred to as "second-order" operations. For example, such second-order operations include finding all design figures overlapped each other, finding an amount of such intersection, finding all neighbors for each design figure, finding an intersection between two design figures in the same layer or in adjacent layers, finding the distance between two neighbor design figures in the same layer, and the like. These operations require some geometrical and/or non-geometrical properties of each design figure. Such second-order operations are typically used for physical design extraction and/or physical design verification purposes. The time for the second-order operations increases by the order of $n^2$ for n design figures since all of the two-figure combinations out of n design figures are to be considered.

Figure 4:
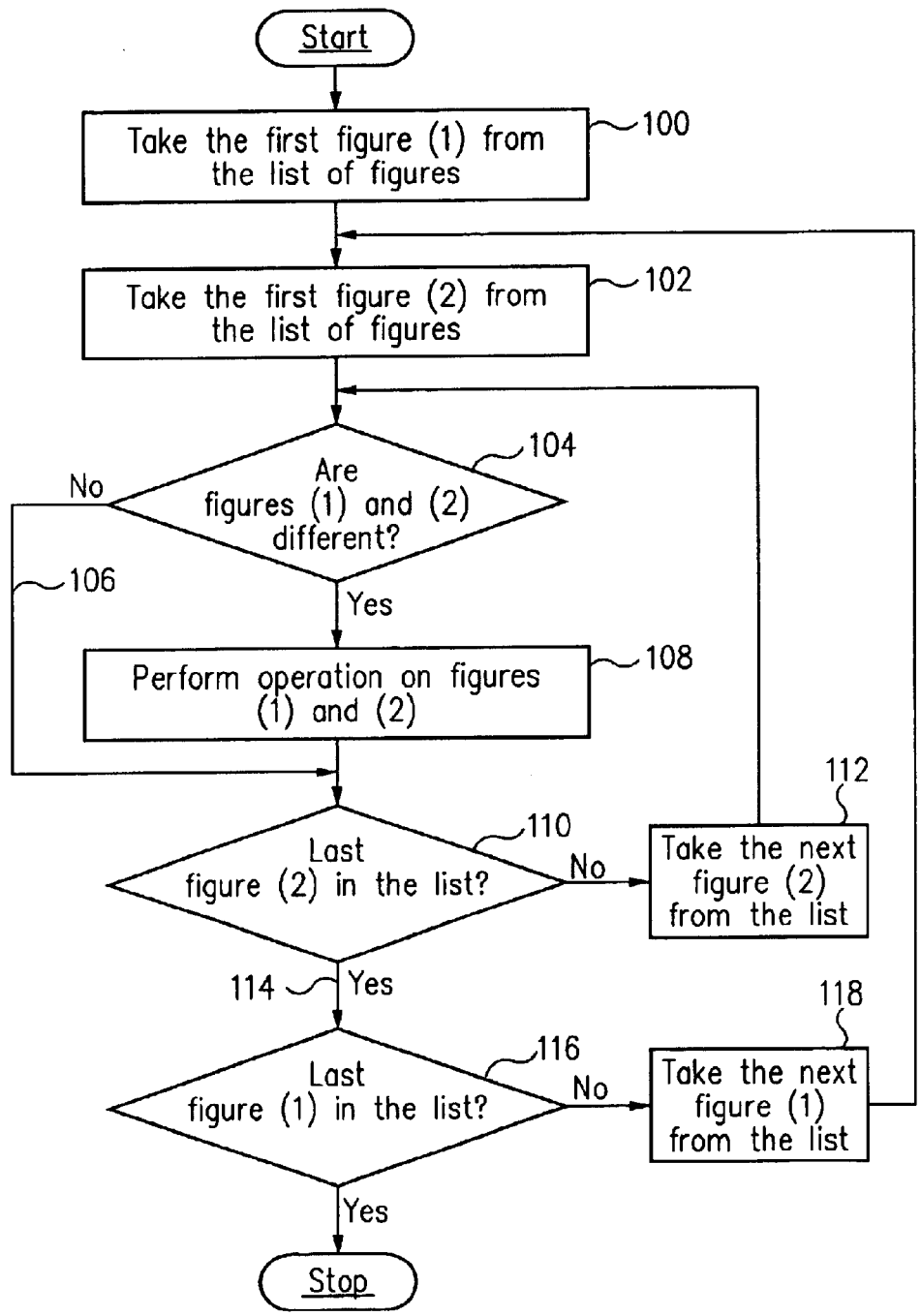
FIG. 4 is a process flow diagram schematically illustrating a conventional second-order operation involving two design figures.

FIG. 4 schematically illustrates a process flow of a conventional second-order operation performed on two design figures (i.e., corresponding data objects) using the built-in functionality of the Opus database. Here, since the design figures (as shown in FIG. 1B, cell view representation) and the data objects (as shown in FIG. 2, stored in the database) have a one-to-one correspondence, the terms "design figure" and the corresponding "data object" are used interchangeably in this specification. When an operation is performed "on design figures," it means that the operation is performed on the corresponding data objects using their properties required for the operation, as mentioned above, as will now be well understood by those of ordinary skill in the art.

To perform figure-to-figure operations, typically, a list of data objects for the entire design figures is prepared. The list is an equivalent of a list of the design figures themselves. The operation is performed on two design figures, and the two operands of the operation are referred to as "FIG. (1)" and "FIG. (2)." First, a first FIG. (1) is taken from the top (first entry) of the list (100), and then a first FIG. (2) is also taken from the top of the list (102). It should be noted that although "list" is used here, providing a specific form of list is not required, and any scheme for selecting design figures (or data objects) in a certain order may be used in performing the figure-to-figure operation.

After selecting two figures, the FIG. (1) and the FIG. (2) are compared against each other (104). If the FIG. (1) and the FIG. (2) are the same design figure (this would be the case for the first-time operation) (106), unless the FIG. (2) is the last design figure on the list (110), the next design figure on the list is taken as the FIG. (2) (112). Since the FIG. (1) (i.e., the first design figure on the list) and the FIG. (2) (i.e., the second design figure on the list) are different this time, the operation is performed on these FIG. (1) and the FIG. (2) (108). By iteratively repeating the steps 104 to 112, the operation is performed on the fixed FIG. (1) with a different FIG. (2) until all of the design figures on the list are selected as the FIG. (2) (114). Then, the next design figure (the second entry) on the list is taken as the FIG. (1) (118) and the process returns to the step 102. These steps are repeated until all of the design figures on the list are selected as the FIG. (1) (116). In this manner, the operation is performed on all of the combinations of two design figures on the list. However, since performing the second-order operations on the entire set of design figure combinations takes such a relatively long time, especially when an IC design includes millions of design figures, the IC design process would be out of schedule, i.e., it would take too long.

Figure 5:
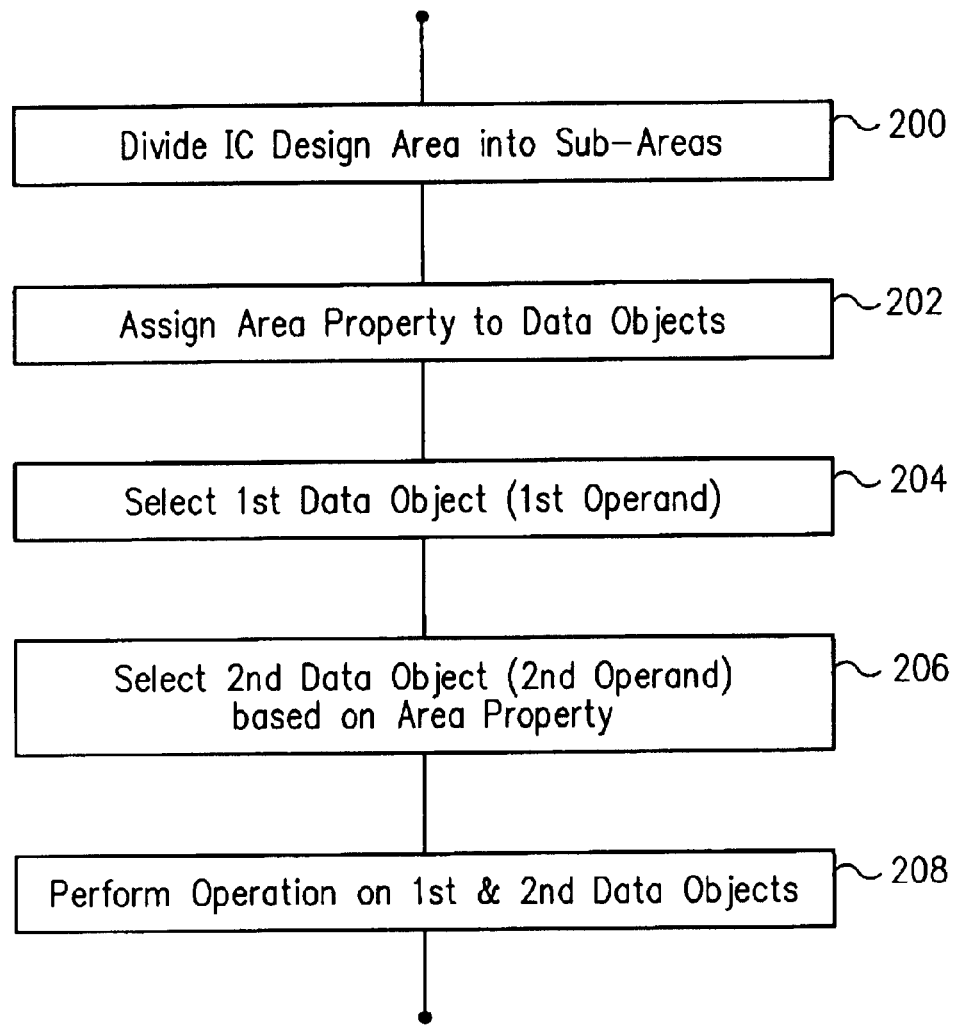
FIG. 5 is a process flow diagram schematically illustrating a method for performing a second-order operation on data objects in accordance with one embodiment of the present invention.
Figure 6:
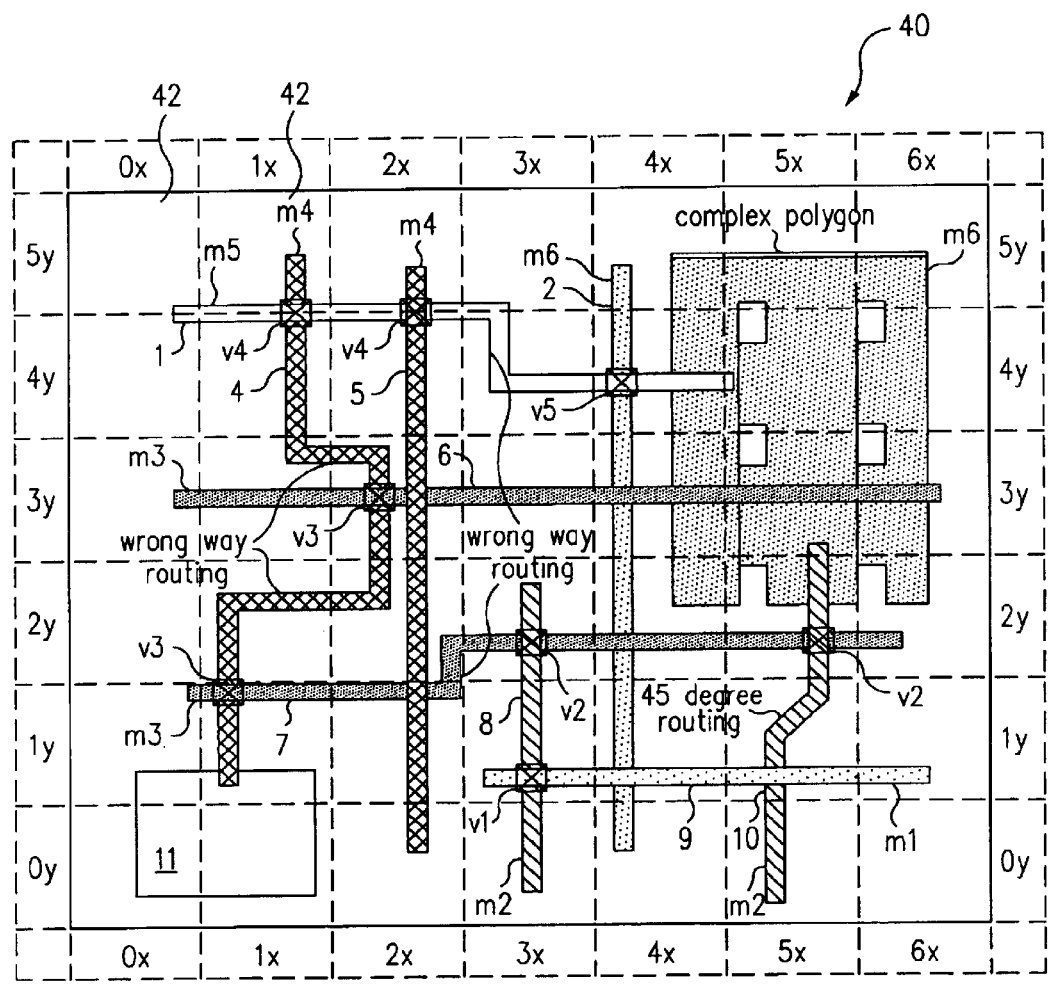
FIG. 6 is a diagram schematically illustrating an IC design area divided into a plurality of sub-areas in accordance with one embodiment of the present invention.

FIG. 5 schematically illustrates a method for performing a second-order operation on data objects in accordance with one embodiment of the present invention. First, an IC design area (typically an IC chip area) is divided into a plurality of sub-areas (200). FIG. 6 schematically illustrates the IC design area 40 so divided into the sub-areas 42. The sub-areas 42 are typically rectangular. For example, as shown in FIG. 6, each sub-area 42 may be specified by a pair of area coordinates (X, Y), where X=0, 1, ... M, Y=0, 1, ..., K, when the IC design area 40 is divided into a matrix of sub-areas 42 having M+1 columns and K+1 rows. In the case of this example, the sub-area 42 at the upper right corner has the area coordinates (X, Y)=(M, K)=(6, 5). Alternatively, the sub-areas 42 may be identified by individually naming them or serially numbering them.

Referring back to FIG. 5, an area property based on the sub-area is then assigned to each of the data objects (202). An area property for a design figure is defined as information indicating the sub-areas on which at least part of the design figure is located. The sub-area information may include the area coordinates, the area name, the area number, or the like. First, a data object is selected as a first operand of the operation (204), for example, form a list of the entire design figures as described above. Then, a second data object (as a second operand) is selected based on the area property (206). More particularly, the second data object is selected from among those design figures which overlap a particular sub-area that is also overlapped by the first-operand design figure. Thus, the second-operand data objects constitute a subset of the design figures. The second-operand data object may be selected based on the area property and optionally one or more other properties. A list of the subsets of the second-operand data objects (design figures) may be created with respect to each selected first-operand data object. The figure-to-figure operation is then performed on the selected first and second data objects (208).

When the area property is assigned to each of the data objects, each design figure is annotated by the area property indicating the sub-area(s) overlapped by the design figure, and also by the property which contain information about the layer on which the design figure is located. That is, each design figure has a reference to the particular sub-area being overlapped. For example, as shown in FIG. 6, the design FIG. 1 overlaps ten (10) sub-areas 42, namely, (0, 4), (0, 5), (1, 4), (1, 5), (2, 4), (2, 5), (3, 4) (3, 5), (4, 4), and (5, 4), as specified by the column-row area coordinates (X, Y). Similarly, the design FIG. 4 overlaps seven (7) sub-areas (1, 1), (1, 2), (1, 3), (1, 4), (1, 5), (2, 2), and (2, 3). Thus, the data object representing the design FIG. 1 has a reference to the area property specifying those ten sub-areas, and the data object representing the design FIG. 4 has a reference to the area property specifying the corresponding seven sub-areas. This area property assignment may be done by examining geometrical properties and non-geometrical properties of the design figure associated with each of the data object, and assigning the area property to the data object based on such examination.

Figure 7:
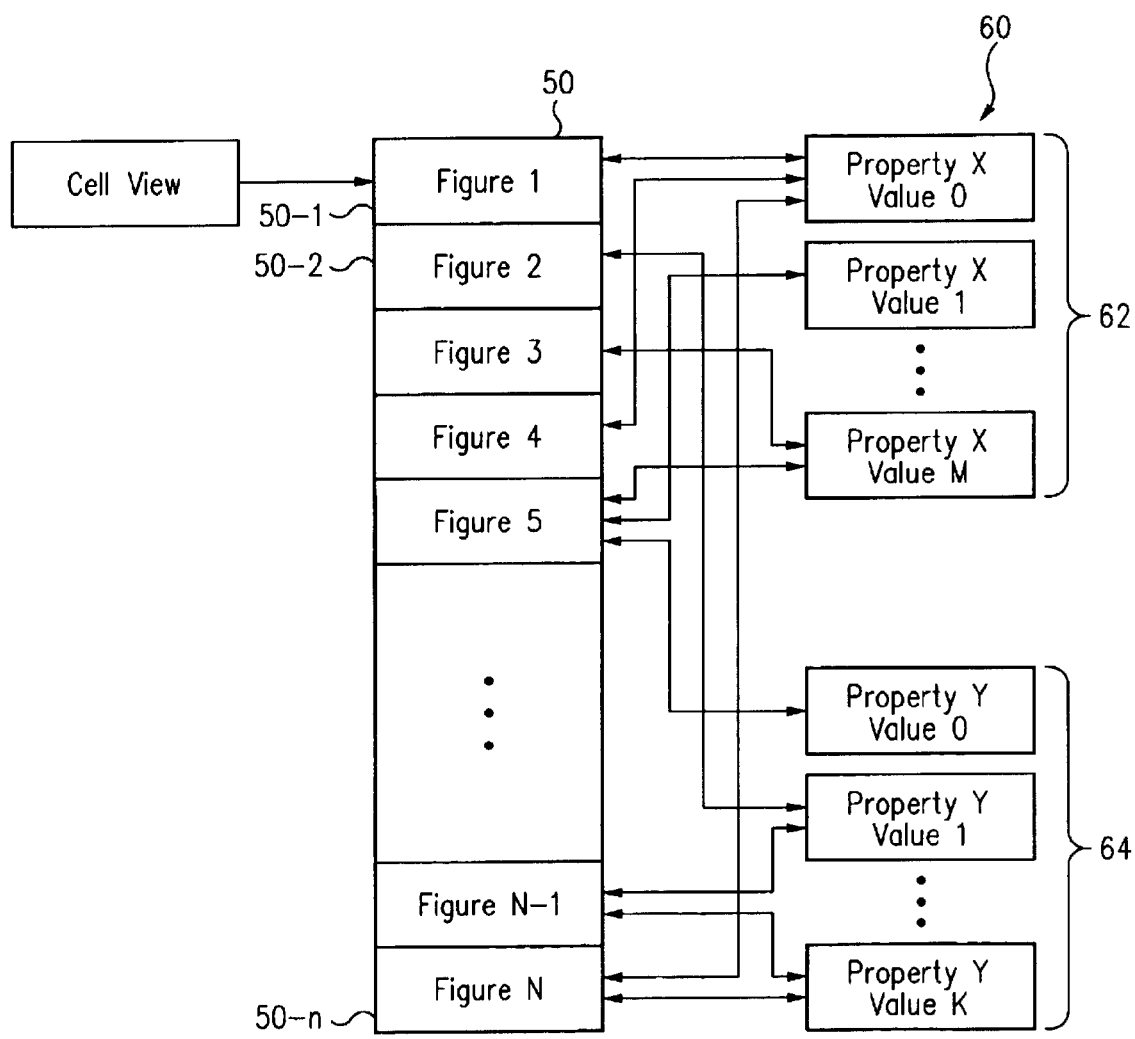
FIG. 7 is a diagram schematically illustrating a physical design data structure stored as data objects in accordance with one embodiment of the present invention.

FIG. 7 schematically illustrates a database structure in which physical design data is stored as data objects in accordance with one embodiment of the present invention. Each of the data objects 50 (50-1, 50-2, . . . , 50-n) represents a design figure (FIG. 1, FIG. 2, . . . , figure N), and an area property 60 is assigned to each of the data objects 50. As shown in FIG. 7, the area property 60 indicates the sub-area information using a pair of property values (area coordinates as discussed above): "property X" 62 having values 0, 1, . . . , M, and "property Y" 64 having values 0, 1, . . . , K. By providing a reference (or link) to the area property 60, the design figures are annotated by the sub-are information. It should be noted that the area property 60 is assigned to the data objects 50 in addition to the conventional properties, such as layer and type of the design figure (not shown in FIG. 7), as discussed above.

Figure 8:
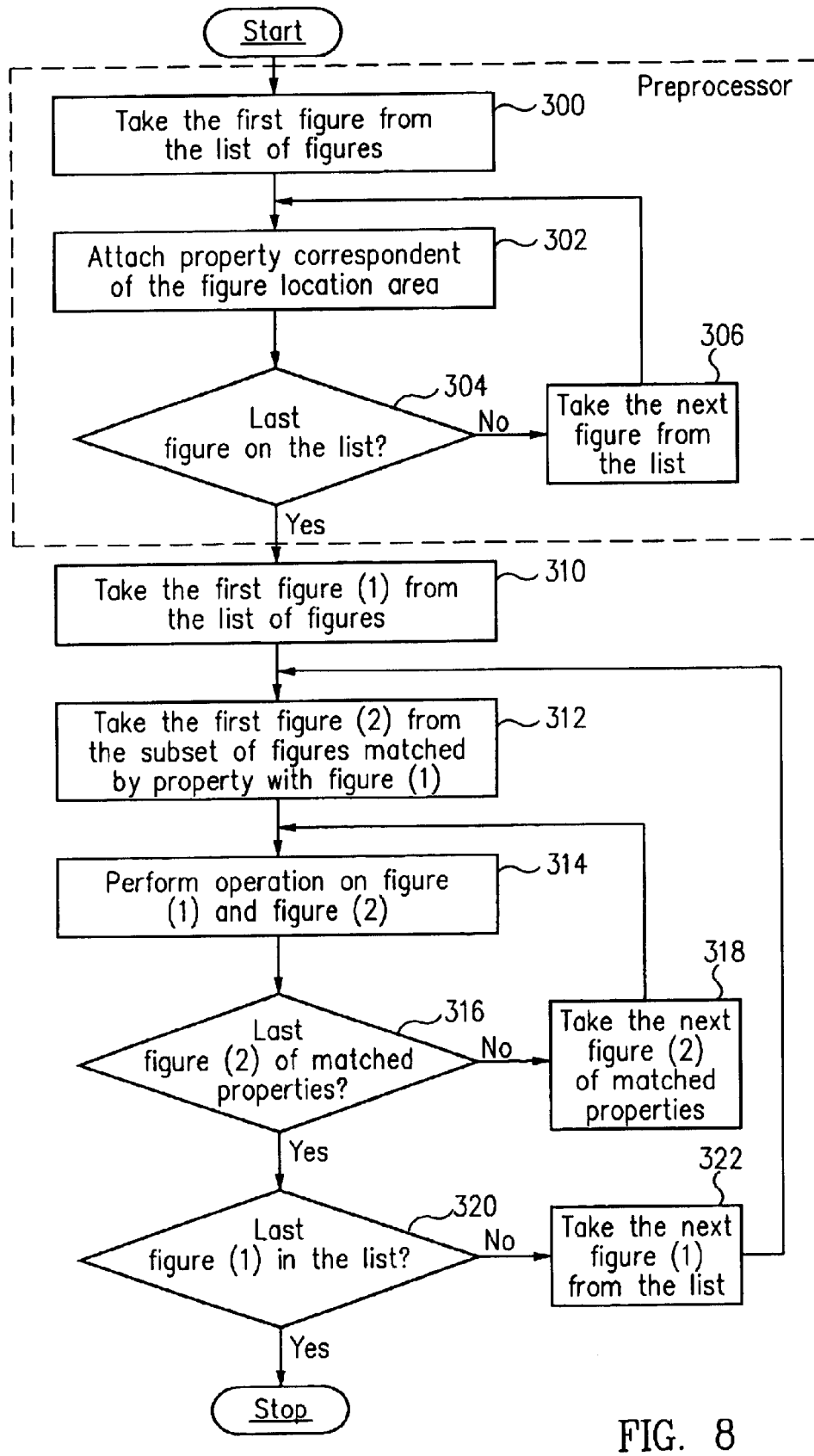
FIG. 8 is a process flow diagram schematically illustrating the area property assignment and the second-order operation in accordance with one embodiment of the present invention.

FIG. 8 schematically illustrates a process flow for the area property assignment (annotation) and the second-order operation in accordance with one embodiment of the present invention. The area property assignment may be performed as a preprocessing for the operation. As shown in FIG. 8, a first design figure (data object) is selected from the list of the entire design figure (300), and the properties corresponding to the design figure location (including the area property) are attached to the data object (302). This procedure is repeated until the properties are assigned to the last design figure on the list (304, 306). The complexity of this preprocessing is close to the linear when the number of the sub-areas is not too large. In order to handle a large number of sub-areas within appropriate time the procedure similar to binary search may be implemented in the procedure. A list of assigned properties for each of the sub-areas may also be created in this preprocessing, which is also an operation of almost linear complexity. For example, a list including associations between area property values (such as the area coordinates, as described above) and the sub-areas may be created. In addition, for each sub-area, a list of design figures which area property indicates that sub-area may be created (i.e., overlapping design figure list for the sub-area).

After preprocessing, the second-order operation is performed as follows. First, a first FIG. (1) is taken from, typically, the top or the first entry of the list of the entire design figures (data objects) (310), and then a first FIG. (2) is taken from a subset of design figures (data objects) (312). The subset includes design figures that are matched by the area property with the design figure selected as the FIG. (1). That is, the data objects included in the subset have an area property indicating a sub-area that is also indicated by an area property of the first data object selected as the FIG. (1). For example, by examining the area property of the design FIG. 1 (shown in FIG. 6), ten sub-areas 42 overlapped by the design FIG. 1 are determined. As described above, they are: (0, 4), (0, 5), (1, 4), (1, 5), (2, 4), (2, 5), (3, 4), (3, 5), (4, 4), and (5, 4)for each of the overlapped sub-areas, design figures that also overlap that sub-area are determined. For example, the sub-areas (1, 4) and (1, 5) are also overlapped by the design FIG. 4, and the sub-areas (2, 4) and (2, 5) are also overlapped by the design FIG. 5. In this manner, the subset for the design FIG. 1 is determined to include the data objects representing the design FIGS. 2, 3, 4 and 5. This may be done by examining data objects and determining if a specific data object has an area property value matching an area property value of the selected data object as FIG. (1).

The subset of the data objects for the second-order operation may depend on the nature of the operation. For example, if the operation is for the layout verification purpose, the subset may include the data objects representing design figures overlap specific sub-areas in the same layer as that of the design figure selected as FIG. (1). In the case of an extraction operation, the list may contain data objects representing design figures overlapping the specific sub-areas in the adjacent layers. Such subsets may be created using the area property and the property indicating layer information or any other necessary information. A list of the subset may be created for each of the data object during the preprocessing after the area property is attached. Alternatively, such a list may be created in response to the selection of the data object as the FIG. (1) during the second-order operation.

After selecting the FIG. (1) from the entire set, typically from the first entry of the list, and the FIG. (2) form the subset, typically from the first entry of the subset-list, the operation is performed on the selected figure (314). The operation is iteratively performed on the fixed FIG. (1) and a different FIG. (2) taken from the subset until all of the data objects in the subset are selected as the FIG. (2) (316, 318). Then, the next FIG. (1) is taken from the second entry of the list of the entire set (322 ), and the process returns to the step 312. The operation is iteratively performed on the newly fixed FIG. (1) and a different FIG. (2) taken from the subset for the current FIG. (1), until all of the data object in the subset are once selected as the FIG. (2). The process is repeated until all of the data objects on the list (the entire set) are selected as the FIG. (1) (320).

As described above, the "external" cycle (312, 320, 322) of selecting a design figure (data object) as the FIG. (1) is performed for the all design figures. An "internal" cycle (314, 316, 318) of taking the FIG. (2) (and performing the operation) is only performed on the subset of the design figures selected for the specific FIG. (1). This internal cycle includes identifying the sub-areas of interest, getting a list of properties for those sub-areas, and iteratively performing the operation on each design figure (data object) annotated by this particular property from the list.

Figure 9:
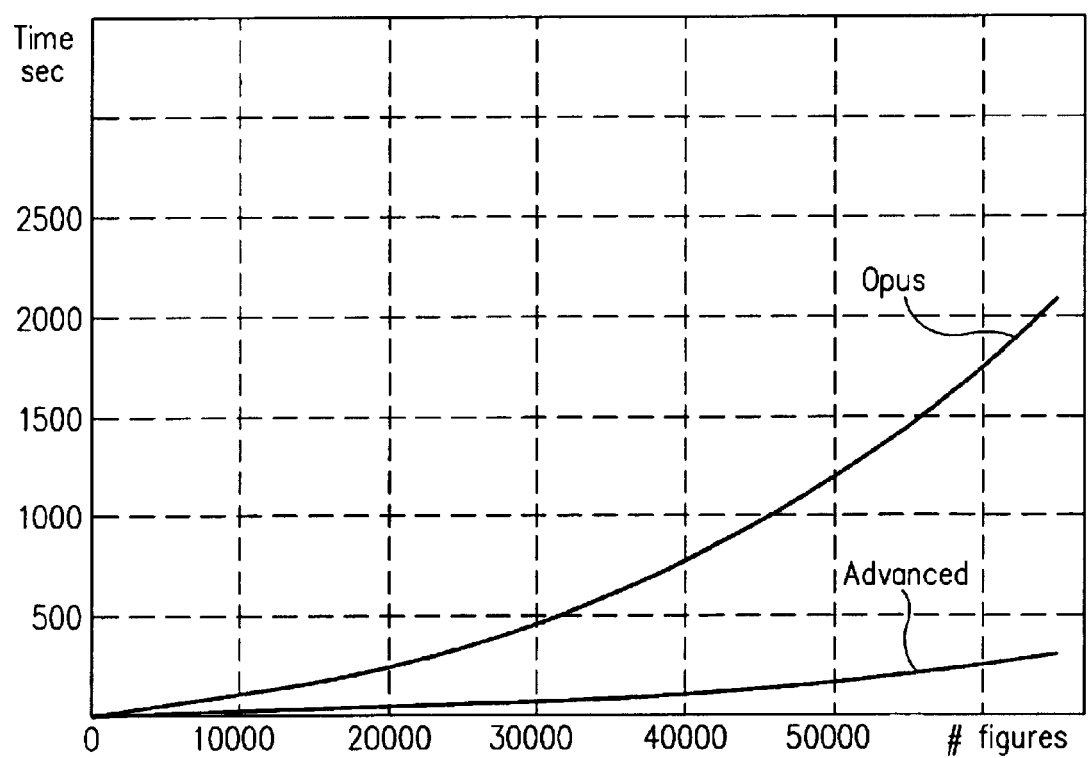
FIG. 9 is a diagram illustrating the relationship between the operation time and the number of design figures for an exemplary application of the method in accordance with one embodiment of the present invention and a conventional method using Opus built-in functionality for comparison.

The approximate worst-case complexity of this operation is of the order of $$N \times \frac{N}{M}$$

where N is the number of design figures (data objects) and M is the number of sub-areas used as a reference in accordance with one embodiment of the present invention. By dynamically selecting the number M dependent on the cell size (or the IC design are size), the complexity may be kept of the order of N×log(N). FIG. 9 illustrates the relationship between the operation time and the number of design figures for an exemplary application of the method in accordance with one embodiment of the present invention and a conventional method using Opus built-in functionality for comparison. As shown in FIG. 9, the increase in process time for the larger number of design figures is significantly smaller than that using the conventional method. For example, the performance improvement is about 20 times in average for the number of sub-areas equal to 32.

In accordance with one embodiment of the present invention, the speed-up of second order operation is proportional to the number of sub-areas and may reach 100 times faster than the conventional method of accessing each design figures of IC design. Since the Opus database format is used for the physical design data storage, no additional data translation is required, eliminating corresponding time and efforts. In addition, using a standard database format supports specific type of design figures such as complex polygons, wrong way routing, and 45 degree routing, which are typically not supported by performance-optimized databases.

In addition, the present invention is also applicable to hierarchical design where operations involve two design figures (or geometric features) of circuit elements. The operation complexity (increase in the operation time/number with respect to increase in the number of the design figures) may be adjusted to any design size by changing the number or size of sub-areas in the design area of interest.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for performing an operation on physical design data of an integrated circuit (IC) design, the IC design including a first plurality of design figures laid-out on a physical layout area for the IC design, each of the design figures being represented by a respective data object stored in a database, said method comprising:
    dividing the physical layout area into a second plurality of non-overlapping sub-areas;
    assigning at least one area property to each of the data objects, the area property indicating a corresponding sub-area on which at least part of the corresponding design figure is to be located;
    selecting a first data object; and conducting an operation involving the first data object and a second data object, said conducting including:
    selecting the second data object from a subset of data objects having an area property indicating a sub-area indicated by an area property of the first data object; and
    performing the operation on the first data object and the second data object.

2. A method in accordance with claim 1 wherein said conducting further includes:
    iteratively repeating said selecting the second data object and said performing so that the operation is performed for all data objects included in the subset.

3. A method in accordance with claim 1, further comprising:
    iteratively repeating said selecting the first data object and said conducting the operation so that the operation is conducted for all data objects corresponding to the first plurality of design figures.

4. A method in accordance with claim 1 wherein said assigning the area property includes:
    creating associations between area property values and the sub-areas.

5. A method in accordance with claim 1 wherein said dividing includes dividing the physical layout area into a second plurality of rectangular areas.

6. A method in accordance with claim 5 wherein the area property of a design figure has property values indicating one or more of the rectangular areas on which at least part of the design figure is to be placed.

7. A method in accordance with claim 1, further comprising:
    creating a list of the data objects corresponding to the first plurality of design figures.

8. A method in accordance with claim 1, further comprising:
    creating a list of the subset of data objects for each of the data objects based on the area property.

9. A method in accordance with claim 1 wherein said conducting further includes:
    creating a list of the subset of data objects for the selected first data object based on the area property.

10. A method in accordance with claim 9 wherein said creating the list includes:
    determining if a data object has an area property value matching an area property value of the selected first data object.

11. A method in accordance with claim 1 wherein said assigning includes:
    examining geometrical properties and non-geometrical properties of the design figure associated with each of the data object; and
    assigning the area property to the data object based on the examination.

12. A method in accordance with claim 11 wherein the geometrical properties include coordinates of the design figure.

13. A method in accordance with claim 11 wherein the non-geometrical properties include at least one of:
    a figure type;
    a layer of the design figure; and
    connectivity of the design figure.

14. A method in accordance with claim 1 wherein the operation includes:
    determining an intersection of a first design figure represented by the first data object and a second design figure represented by the second data object.

15. A method in accordance with claim 14 wherein the operation further includes:
    determining an amount of the intersection of the first design figure and the second design figure.

16. An apparatus for performing an operation on physical design data of an integrated circuit (IC) design, the IC design including a first plurality of design figures laid-out on a physical layout area for the IC design, each of the design figures being represented by a respective data object stored in a database, said apparatus comprising:

means for dividing the physical layout area into a second plurality of non-overlapping sub-areas;

means for assigning at least one area property to each of the data objects, the area property indicating a corresponding sub-area on which at least part of the corresponding design figure is to be located;

means for selecting a first data object; and means for conducting an operation involving the first data object and a second data object, said means for conducting including:

means for selecting the second data object from a subset of data objects having an area property indicating a sub-area indicated by an area property of the first data object; and means for performing the operation on the first data object and the second data object.

17. An apparatus in accordance with claim 16 wherein said means for conducting further includes:

means for iteratively executing said means for selecting the second data object and said means for performing so that the operation is performed for all data objects included in the subset.

18. An apparatus in accordance with claim 16, further comprising:

means for iteratively executing said means for selecting the first data object and said means for conducting the operation so that the operation is conducted for all data objects corresponding to the first plurality of design figures.

19. An apparatus in accordance with claim 16 wherein said means for assigning the area property includes:

means for creating associations between area property values and the sub-areas.

20. An apparatus in accordance with claim 16 wherein said means for dividing includes:

means for dividing the physical layout into a second plurality of rectangular areas.

21. An apparatus in accordance with claim 20 wherein the area property of a design figure has property values indicating one of more of the rectangular areas on which at least part of the design figure is to be placed.

22. An apparatus in accordance with claim 16, further comprising:

means for creating a list of the data objects corresponding to the first plurality of design figures.

23. An apparatus in accordance with claim 16, further comprising:

means for creating a list of the subset of data objects for each of the data objects based on the area property.

24. An apparatus in accordance with claim 16 wherein said means for conducting further includes:

means for creating a list of the subset of data objects for the selected first data object based on the area property.

25. An apparatus in accordance with claim 24 wherein said means for creating the list includes:

means for determining if a data object has an area property value matching an area property value of the selected first data object.

26. An apparatus in accordance with claim 16 wherein said means for assigning includes:

means for examining geometrical properties and non-geometrical properties of the design figure associated with each of the data object; and means for assigning the area property to the data object based on the examination.

27. An apparatus in accordance with claim 26 wherein said geometrical properties include coordinates of the design figure.

28. An apparatus in accordance with claim 26 wherein said non-geometrical properties include at least one of:

a figure type;

a layer of the design figure; and connectivity of the design figure.

29. An apparatus in accordance with claim 16 wherein said means for performing includes:

means for determining an intersection of a first design figure represented by the first data object and a second design figure represented by the second data object.

30. An apparatus in accordance with claim 29 wherein said means for performing further includes:

means for determining an amount of the intersection of the first design figure and the second design figure.

31. A program storage device readable by a machine, tangibly embodying a program of instructions executable by the machine to perform a method for performing an operation on physical design data of an intergrated circuit (IC) design, the IC design including a first plurality of design figures laid-out on a physical layout area for the IC design, each of the design figures being represented by a respective data object stored in a database, said method comprising:

dividing the physical layout area into a second plurality of non-overlapping sub-areas;

assigning at least one area property to each of the data objects, the area property indicating a corresponding sub-area on which at least part of the corresponding design figure is to be located;

selecting a first data object; and conducting an operation involving the first data object and a second data object, said conducting including:

selecting the second data object from a subset of data objects having an area property indicating a sub-area indicated by an area property of the first data object; and performing the operation on the first data object and the second data object.

32. A program storage device in accordance with claim 31 wherein said conducting further includes:

iteratively repeating said selecting the second data object and said performing so that the operation is performed for all data objects included in the subset.

33. A program storage device in accordance with claim 32 wherein said method further comprising:

iteratively repeating said selecting the first data object and said conducting the operation so that the operation is conducted for all data objects corresponding to the first plurality of design figures.

* * * * *